(12) United States Patent
Yang

(10) Patent No.: US 6,337,233 B2
(45) Date of Patent: Jan. 8, 2002

(54) METHOD OF MANUFACTURING A POLYCRYSTALLINE SILICON LAYER

(75) Inventor: Myoung-Su Yang, Kyonggi-do (KR)

(73) Assignee: LG. Philips LCD Co., Ltd., Seoul (KR)

(*) Notice: Subject to any disclaimer, the term of this patent is extended or adjusted under 35 U.S.C. 154(b) by 0 days.

(21) Appl. No.: 09/750,158

(22) Filed: Dec. 29, 2000

(30) Foreign Application Priority Data

Dec. 31, 1999 (KR) .............................................. 99-67848

(51) Int. Cl.[7] .......................... H01L 21/00; H01L 21/84
(52) U.S. Cl. .................... 438/158; 438/166; 438/169; 438/174
(58) Field of Search ..................... 438/166, 57, 174, 438/168, 162, 517, 169; 257/72, 79, 83

(56) References Cited

U.S. PATENT DOCUMENTS

| | | | | |
|---|---|---|---|---|
| 5,529,951 A | * | 6/1996 | Noguchi et al. ............ | 437/174 |
| 5,821,135 A | * | 10/1998 | Mei et al. .................... | 438/57 |
| 5,897,347 A | * | 4/1999 | Yamazaki et al. .......... | 438/166 |
| 5,981,974 A | * | 11/1999 | Makita ....................... | 257/72 |
| 6,066,516 A | * | 5/2000 | Miyasaka ................... | 438/169 |
| 6,071,764 A | * | 6/2000 | Zhang et al. ............... | 438/166 |
| 6,110,770 A | * | 8/2000 | Zhang et al. ............... | 438/166 |
| 6,124,155 A | * | 9/2000 | Zhang et al. ............... | 438/158 |
| 6,140,668 A | * | 10/2000 | Mei et al. .................... | 257/66 |
| 6,165,876 A | * | 12/2000 | Yamazaki et al. .......... | 438/517 |
| 6,180,439 B1 | * | 1/2001 | Yamazaki et al. .......... | 438/162 |
| 6,242,291 B1 | * | 6/2001 | Kusumoto et al. ......... | 438/158 |
| 6,242,292 B1 | * | 6/2001 | Yamazaki et al. .......... | 438/166 |

* cited by examiner

*Primary Examiner*—Michael Lebentritt

(57) ABSTRACT

The present invention discloses a method of manufacturing a polycrysalline silicon layer, comprising: depositing an amorphous silicon layer on a substrate; patterning the amorphous silicon layer to form a semiconductor layer having saw-toothed portions at both sides; and scanning the semiconductor layer from the saw-toothed side portion using a laser beam to form a polycyrstalline silicon layer. The laser beam has a line shape elongated in a perpendicular direction to a scanning direction. The grain size can be larger and the number of grain boundaries is reduced.

3 Claims, 4 Drawing Sheets

METHOD OF MANUFACTURING A POLYCRYSTALLINE SILICON LAYER

CROSS REFERENCE

This application claims the benefit of Korean Patent Application No. 1999-67848, filed on Dec. 31, 1999, under 35 U.S.C. §119, the entirety of which is hereby incorporated by reference.

BACKGROUND OF THE INVENTION

1. Field of the Invention

The present invention relates to a method of manufacturing a polycrystalline silicon layer of a switching element, for example, a thin film transistor (TFT).

2. Description of Related Art

A thin film transistor (TFT) includes an insulating layer, a passivation film, electrode layers and a semiconductor layer. The insulating layer is made of SiNx, $SiO_2$, $Al_2O_3$ or TaOx. The passivation film is made of a transparent organic insulating material or a transparent inorganic insulating material. The electrode layer includes a gate electrode, a source electrode and a drain electrode and is made of a conductive metal such as Al, Cr or Mo. The semiconductor layer acts as a channel region along which charges flow and is made of amorphous silicon or polycrystalline silicon.

A process of manufacturing the semiconductor layer using the amorphous silicon can be performed at a low temperature of about 350° C. and thus is relatively simple. However, since a field effect mobility of the amorphous silicon layer is as low as 2 □/Vsec, thus, switching characteristics of the TFT and an incorporation characteristics between a driving circuit and the TFT are not so good.

Meanwhile, the polycrystalline silicon layer is much more excellent in response speed than the amorphous silicon layer. The polycrystalline silicon layer has as a high field effect mobility as about 20 □/Vsec to about 550 □/Vsec. A switching speed of the TFT depends on the field effect mobility. That is, a switching speed of the polycrystalline silicon layer is 100 times as fast as that of the amorphous silicon layer. This comes from that the polycrystalline silicon layer is more in grain number and is smaller in defect than the amorphous silicon layer.

A method of manufacturing the polycrystalline silicon layer includes an eximer laser annealing technique, a solid phase crystallization (SPC) technique, and a metal induced crystallization (MIC) technique.

The eximer laser annealing technique is performed at a low temperature and, thus a low-cost glass substrate is used. The TFT manufactured using the eximer laser annealing technique has a field effect mobility more than 100 □/Vsec and thus is excellent in operating characteristics.

The solid phase crystallization technique is one which amorphous silicon is crystallized at a high temperature of more than 600° C. Since a crystallization is performed at a solid phase, a grain has many defects such as a micro-twin, a dislocation and the like, whereupon a grade of a grain is low. In order to compensate for this problem, a thermal oxidation film of about 1000° C. is used as a gate insulating layer. Therefore, since a high-cost material such as quartz is used for the substrate, there is a problem that a production cost is high.

The metal induced crystallization technique is one that a crystallization is performed in such a way that a metal layer is deposited on the amorphous silicon layer and then a heat treatment is performed. The metal layer serves to lower an enthalpy of the amorphous silicon layer. As a result, a process is possible at a low temperature of about 500° C. However, a surface state and electrical characteristics are not so good. This technique also causes many defects in grain.

The polycrystalline silicon layer manufactured using the techniques described above can obtain grains while the silicon of a liquid state is cooled from a silicon seed at the beginning stage of crystallization. In case that a grain of the silicon grows laterally, large-sized grains can be obtained. If a distance between adjacent silicon seeds is greater than a maximum silicon growth distance, the silicon grain that performs a lateral growth centering the silicon seed grows maximally, and then a small-sized grains are created on a region of a liquid state due to a nucleus generated by a super-cooling. However, a distance between adjacent silicon seeds is smaller than a maximum silicon growth distance, a lateral growth occurs centering a seed, forming grain boundaries, whereby the polycrystalline silicon layer having large-sized grains is formed. As described above, in order to obtain the excellent TFT, the large-sized grains should uniformly be arranged while forming the grain boundaries.

FIGS. 1A to 1C are plan views illustrating a crystallization process of a polycrystalline silicon layer. A distance between the two adjacent silicon seeds 11 is smaller than a maximum grain growth distance, but it is desirable that the silicon seeds 11 are uniformly distributed. The silicon grains 13 of a liquid state grow laterally centering on the silicon seed 11 and complete their growth while forming grain boundaries 15.

Hereinafter, a crystallization process of the polycrystalline silicon layer using the eximer laser annealing technique according to a conventional art is explained in detail.

FIG. 2 is a perspective view illustrating a configuration of a polycrystalline silicon crystallization equipment using the eximer laser annealing technique. The equipment includes a laser beam device (not shown), a mask 33, and a projection lens 35. The projection lens 35 is arranged over a substrate 31, and the mask 33 is aliened with the projection lens 35. When a laser beam 37 is projected from the laser beam device toward the mask 33, the laser beam 37 becomes incident along the mask pattern. The laser beam incident to the mask 33 passes through the projection lens 35 and is concentrated on a substrate 31 having an amorphous silicon layer formed thereon, whereby polycrystallization of the amorphous silicon layer is performed according to the mask pattern.

At this point, a growth of the polycrystalline grain is controlled by a shape and an energy density of the laser beam and a temperature and a cooling speed of the substrate. A silicon grain during a crystallization process is divided into three regions: a low energy density region; an intermediate energy density region; and a high energy density region. The low energy density region is a partially melt region. That is, the lower energy density region is one which only a lower portion of the silicon layer is not melt and a silicon melting depth is smaller than a thickness of the silicon layer and a grain diameter is smaller than a thickness of the silicon layer because seeds on the lower portion of the silicon layer grow vertically.

The intermediate energy density region is an almost completely melt region. That is, the intermediate energy density is one which only part of seeds on the lower portion of the silicon layer is not completely melted. Except for part of seed on the lower portion of the silicon layer, almost part of the silicon layer is completely melted. This region is also a region that a lateral growth is possible centering on the seeds.

The high energy density region is one that even the lower portion of the silicon layer is completely melted.

A crystallization method using the polycrystalline silicon crystallization equipment of FIG. 2 is as follows. The laser beam 37 is uniformed by predetermined means. Thereafter, a type of a laser beam that will be formed on the substrate 31 is determined through the mask 33. A laser beam having a width of tens of □ is formed through the projection lens 35. The substrate 31 arranged on a stage moves slowly at a speed of less than 1 □/pulse, so that a crystallization is performed by the laser beam. The mask 33 has divided regions "A", "B", and "C" in shape of stripe.

FIG. 3 is a plan view illustrating a mechanism that the amorphous silicon layer is crystallized through the laser beam. At this time, in first and second crystallization steps 45, a lateral growth occurs by moving the substrate 31. At the second step, a grain boundary 41 of the first step moves and forms a new grain boundary 41a. Preferably, a high energy density for complete melting is used, and a width of the laser beam is smaller than twice of the maximum lateral growth distance.

After an n-th crystallization step, grains of the polycrystalline silicon that is crystallized by the lateral growth grows as large as a grain 43 and the grain boundary 41n is finally determined.

FIG. 4 is a plan view illustrating the semiconductor layer manufactured through the above-described method. The semiconductor layer 55 that will be formed between the source and drain electrodes 51 and 53 includes a plurality of polycrystalline silicon grains 55a. Since a width of the grain 55 is so small, for example, in a range of about 1000 Å to about 2000 Å, the semiconductor layer 55 has a large number of grain boundaries 55b, which affects the charge flow between the source and drain electrodes to be lowered. This is because a trap level of charge occurs at the grain boundary 55b. Accordingly, as the number of the grain boundaries increases, electrical characteristics of the TFT become lowered.

SUMMARY OF THE INVENTION

To overcome the problems described above, preferred embodiments of the present invention provide a method of manufacturing a polycrystalline silicon layer having excellent electrical characteristics.

In order to achieve the above object, the preferred embodiments of the present invention provide a method of manufacturing a polycrysalline silicon layer, comprising: depositing an amorphous silicon layer on a substrate; patterning the amorphous silicon layer to form a semiconductor layer having saw-toothed portions at both sides; and scanning the semiconductor layer from the saw-toothed side portion using a laser beam to form a polycyrstalline silicon layer. The laser beam has a line shape elongated in a perpendicular direction to a scanning direction.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFERRED EMBODIMENTS

Reference will now be made in detail to preferred embodiments of the present invention, example of which is illustrated in the accompanying drawings.

Figure 1A:
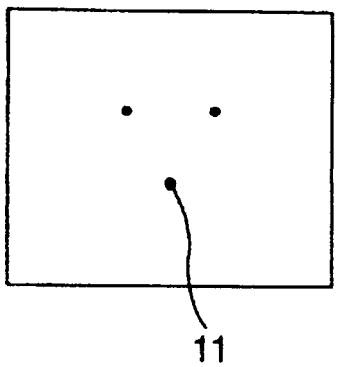
FIGS. 1A to 1C are plan views illustrating a typical crystallization process of a polycrystalline silicon layer.
Figure 1B:
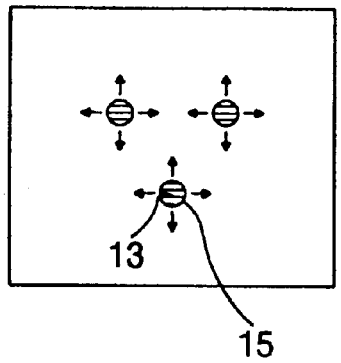
Figure 1C:
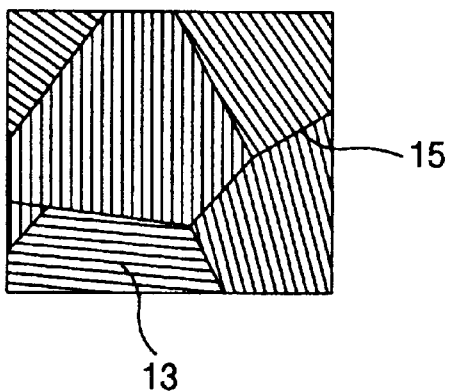
Figure 2:
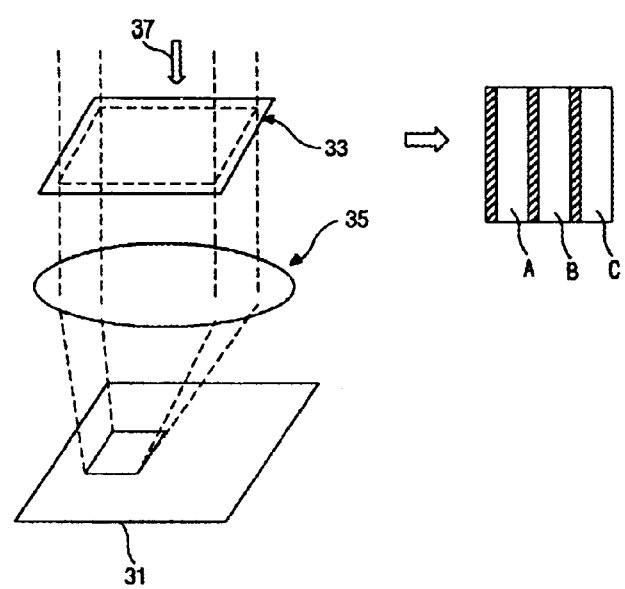
FIG. 2 is a perspective view illustrating a configuration of a polycrystalline silicon crystallization equipment using the eximer laser annealing technique.
Figure 3:
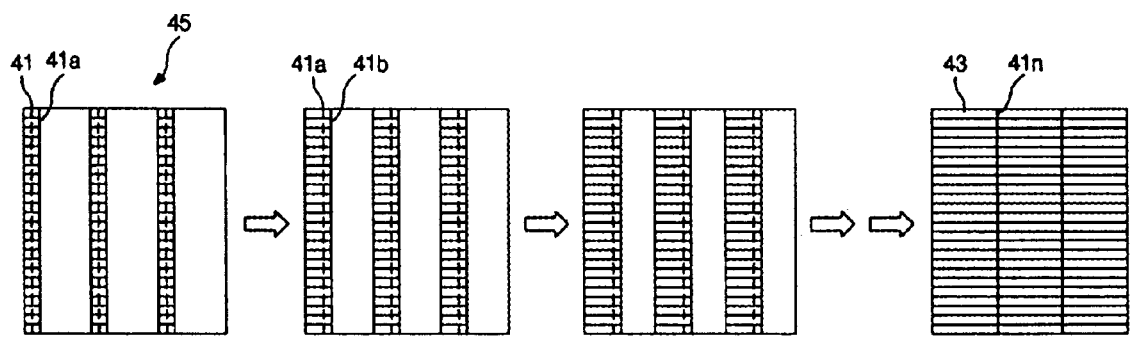
FIG. 3 is a plan view illustrating a mechanism that an amorphous silicon layer is crystallized through the polycrystalline silicon crystallization equipment of FIG. 2.
Figure 4:
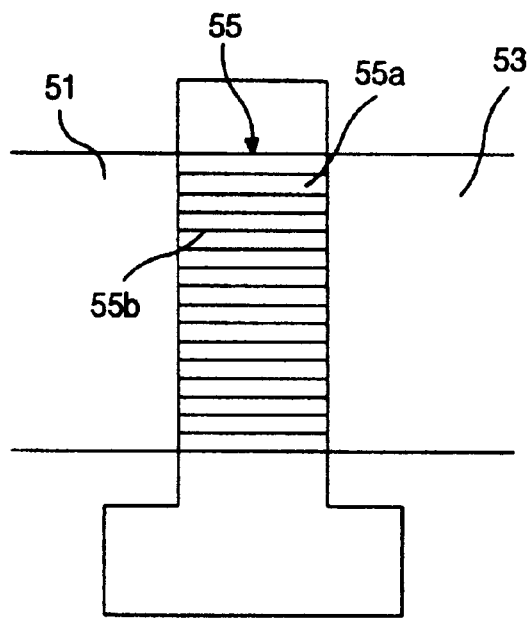
FIG. 4 is a plan view illustrating a polycrystalline silicon layer manufactured according to a conventional art.
Figure 5:
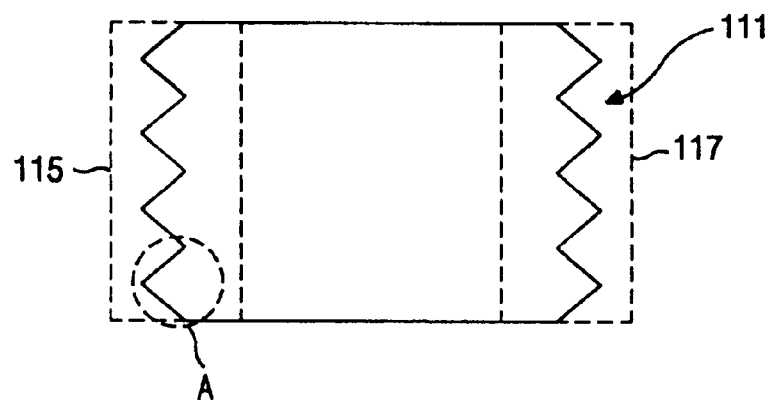
FIG. 5 is a plan view illustrating a silicon layer patterned according to a preferred embodiment of the present invention.

FIG. 5 is a plan view illustrating a patterned silicon layer according to the preferred embodiment of the present invention. First, a first insulating layer is formed on a substrate. The first insulating layer is made of $SiO_2$ or SiNx. An amorphous silicon layer is deposited on the first insulating layer and patterned into a semiconductor layer 111 having saw-toothed side portions, which are arranged between source and drain electrode regions 115 and 117. Thereafter, the semiconductor layer 111 is scanned from a left-hand side by the eximer laser beam using a mask having a line shaped exposure part. At this time, crystallization begins at angular points of the protruding portions of the saw-toothed side portions.

Figure 6:
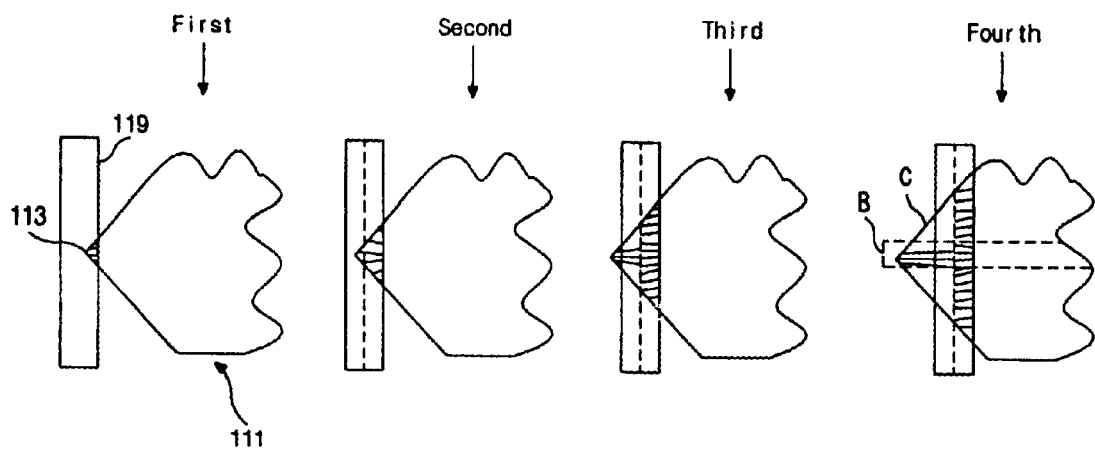
FIG. 6 is an enlarged view illustrating a portion A of FIG. 5, illustrating a crystallization process according to the preferred embodiment of the present invention.

FIG. 6 is an enlarged view illustrating a portion "A" of FIG. 5, illustrating a crystallization process according to the preferred embodiment of the present invention. As shown in FIG. 6, grains and grain boundaries of the silicon layer are formed through several crystallization steps. A line width 119 of the eximer laser beam completely overlaps a portion of the patterned silicon layer 111 through the first crystallization process to the third crystallization process. After the third crystallization process, a lateral growth of the polycrystalline silicon layer begins.

In the first crystallization process, a portion of the line beam scans the angular portion of the protruding portion of the saw-toothed side portions. A nucleus of a grain, which is formed at the angular point of the protruding portion of the saw-toothed side portions, grows laterally through the second and third crystallization processes. At this time, grains on a portion B extending from the angular point of the protruding portion of the saw-toothed side portions grows in the same way as the conventional growth way. However, on the rest portion excluding for the portion B (i.e., both side portion of the protruding portion of the saw-toothed side portions), a growth of grains is induced in a direction perpendicular to a scanning direction of the laser beam to a boundary "C" of the semiconductor layer. Therefore, grains that grow to the portion B of the protruding portions of the saw-toothed side portions continue to laterally grow in a right-hand direction that is a laser scanning direction.

Figure 7:
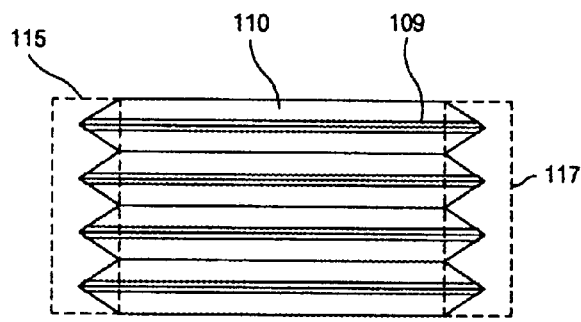
FIG. 7 is a plan view illustrating a surface of the polycrystalline silicon layer according to the preferred embodiment of the present invention.

FIG. 7 is a plan view illustrating a surface of the semiconductor layer manufactured according to the preferred embodiment of the present invention. As shown in FIG. 7, a width of grains 110 of the polycrystalline silicon layer extends from the source electrode region 115 to the drain electrode region 117. The grain boundaries 109 of the polycrystalline silicon layer are formed in one direction of the source electrode 115 to the drain electrode 117. At this time, grains, that are formed in one direction of the source electrode 115 to the drain electrode 117, have a width of tens of □. Therefore, due to grains having a big size and less grain boundaries, a charge flow between the source electrode 115 and the drain electrode 117 is not affected by the grain boundaries.

The polycrystalline silicon layer described above may be used as a semiconductor channel of the switching element, for example, the thin film transistors.

Herein before, using the method of manufacturing the semiconductor layer of the switching element according to the preferred embodiment of the preferred embodiment of the present invention, since the polycrystalline silicon layer can have large-sized grains, a switching element having excellent electrical characteristics can be obtained.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of manufacturing a polycrysalline silicon layer, comprising:

depositing an amorphous silicon layer on a substrate;

patterning the amorphous silicon layer to form a semiconductor layer having saw-toothed portions at both sides; and scanning the semiconductor layer from the saw-toothed side portion using a laser beam to form a polycyrstalline silicon layer.

2. The method of claim 1, wherein the laser beam is an eximer laser beam.

3. The method of claim 1, wherein the laser beam has a line shape elongated in a perpendicular direction to a scanning direction.

* * * * *